US008782881B2

(12) United States Patent
Rümmler

(10) Patent No.: US 8,782,881 B2
(45) Date of Patent: Jul. 22, 2014

(54) MOUNTING METHOD FOR MOUNTING A CIRCUIT BOARD IN A HOUSING AND ASSOCIATED MOUNTING TOOL

(75) Inventor: Maik Rümmler, Baunach (DE)

(73) Assignee: Brose Fahrzeugteile GmbH & Co. Kommanditgesellschaft, Hallstadt, Hallstadt (DE)

(*) Notice: Subject to any disclaimer, the term of this patent is extended or adjusted under 35 U.S.C. 154(b) by 130 days.

(21) Appl. No.: 13/447,453

(22) Filed: Apr. 16, 2012

(65) Prior Publication Data
US 2012/0260499 A1 Oct. 18, 2012

(30) Foreign Application Priority Data
Apr. 15, 2011 (DE) .......................... 10 2011 017 314

(51) Int. Cl.
H05K 3/20 (2006.01)
(52) U.S. Cl.
USPC .................. 29/831; 29/832; 29/837; 29/842; 29/846
(58) Field of Classification Search
USPC ....................... 29/831, 832, 837, 842, 846, 85
See application file for complete search history.

(56) References Cited

U.S. PATENT DOCUMENTS

| 4,394,795 | A | * | 7/1983 | Goss | 29/739 |
| 4,744,140 | A | * | 5/1988 | Bright | 29/741 |
| 5,977,499 | A | * | 11/1999 | Black et al. | 200/303 |
| 6,415,493 | B1 | | 7/2002 | Pawlenko et al. | |
| 6,678,945 | B2 | * | 1/2004 | Eaton et al. | 29/762 |
| 6,778,400 | B2 | * | 8/2004 | Kurle et al. | 361/752 |

FOREIGN PATENT DOCUMENTS

EP 1895823 A1 3/2008

* cited by examiner

Primary Examiner — Paul D Kim
(74) Attorney, Agent, or Firm — Laurence A. Greenberg; Werner H. Stemer; Ralph E. Locher

(57) ABSTRACT

A mounting method for a circuit board. The circuit board is formed with pilot holes that are placed onto pilot pins of a tool such that the pilot pins protrude through and beyond the circuit board. Then the tool is displaced toward a circuit board holder of the housing whereupon the pilot pins engage with a form fit in corresponding centering holes of the circuit board holder. After fixing the circuit board in the housing, the tool is withdrawn by detaching the pilot pins from the pilot holes, the circuit board remaining in the circuit board holder. The tool has an upper plate with associated pilot pins and a lower plate with a housing holder for positioning the housing. The circuit board, with the pilot pins engaging the pilot holes, is displaced by moving the upper plate toward the lower plate.

8 Claims, 3 Drawing Sheets

MOUNTING METHOD FOR MOUNTING A CIRCUIT BOARD IN A HOUSING AND ASSOCIATED MOUNTING TOOL

CROSS-REFERENCE TO RELATED APPLICATION

This application claims the priority, under 35 U.S.C. §119, of German patent application DE 10 2011 017 314.5-34, filed Apr. 15, 2011; the prior application is herewith incorporated by reference in its entirety.

BACKGROUND OF THE INVENTION

Field of the Invention

The invention relates to a mounting method for mounting a circuit board in a housing. The invention also relates to a mounting tool for carrying out the method. In the application that is primarily targeted, the housing is an electronics module in a motor vehicle, in particular an electrical window lifter.

A circuit board conventionally comprises an insulating supporting board (also referred to as a "substrate"), which is provided with electrical conductor tracks and also electrical or electronic components. In the case of circuit boards such as are used particularly for electronics modules for motor vehicles, the conductor tracks are often printed onto the substrate from electrically conductive material. These are also referred to as "PCBs" (i.e., printed circuit boards).

In a production process that is particularly advantageous for automated production in particular, circuit boards are press-contacted with electrical terminal conductors when they are inserted into the housing. This involves press-in pins or "press-fit pins" (also referred to hereafter as press-contact pins) of the housing being pressed into corresponding metalized contact holes of the circuit board, whereby a solder-free electrical connection is established. In order that such press-contact connections are however closed reliably and durably, very precise positioning of the circuit board with respect to the housing is necessary when establishing such a press-contact connection. Even minor maladjustment of the press-contact pins with respect to the contact holes may lead to inadmissible widening of the contact holes, bending or breaking of individual press-contact pins or other production defects.

For easy and precise adjustment of the circuit board during insertion, protruding pilot pins onto which the circuit board is fitted with corresponding centering holes (hereafter also referred to as "pilot holes") are often provided in a circuit board holder of the housing. The pilot pins generally taper in the region of their free ends, in order to facilitate the fitting on of the circuit board. As a result of the structural design, the circuit board to be inserted is still guided with a certain amount of play on the pilot pins because of the tapering when it comes into contact with the tips of the press-contact pins during the inserting operation. The reason for this is in particular that the pilot pins can only protrude beyond the press-contact pins to a small extent because of the often very flat construction of the housing. As a result, the circuit board often initially rests on the tips of the press-contact pins before the press-contact pins "find" the associated contact holes and the pressing-on operation can be concluded. This may disadvantageously have the effect that the press-contact pins damage the metalized area around the contact holes, which may lead to material abrasion or uplift. Damage to the metal layer in the contact hole may—in the case of a multilayered circuit board—particularly lead to undesired delamination.

SUMMARY OF THE INVENTION

It is accordingly an object of the invention to provide a mounting method for mounting a circuit board in a housing which overcomes the above-mentioned disadvantages of the heretofore-known devices and methods of this general type and which makes it possible to position the circuit board particularly precisely in a housing by simple means. It is a further object of the invention to provide a (mounting) tool with which the mounting method can be carried out particularly well.

With the foregoing and other objects in view there is provided, in accordance with the invention, a method of mounting a circuit board in a housing, the method which comprises:

providing a circuit board with at least one pilot hole and placing the circuit board onto a mounting tool having a number of pilot pins, wherein each of the number of pilot pins protrudes through and projects beyond the circuit board on a side facing away from the mounting tool;

displacing the mounting tool toward a circuit board holder of the housing to cause the pilot pins or at least one of the pilot pins to engage in a corresponding centering hole of the circuit board holder;

fixing the circuit board in the housing; and withdrawing the mounting tool by detaching each pilot pin from the corresponding pilot hole, with the circuit board remaining in the circuit board holder.

Preferably, the at least one pilot hole is one of a plurality of pilot holes formed in the circuit board and the mounting tool is provided with a plurality of pilot pins disposed at locations corresponding to locations of the pilot hoes of the circuit board.

With the above and other objects in view there is provided, in accordance with the invention, a mounting tool for mounting a circuit board on a circuit board holder in a housing, the mounting tool being configured to carry out the above-summarized mounting method. The novel mounting tool comprising:

a tool upper plate having associated therewith one or more pilot pins, and a tool lower plate having a housing holder for positioning the housing;

wherein the circuit board can be placed with the or each pilot hole provided therein onto the respectively corresponding pilot pin, and wherein the tool upper plate is displaceable toward the lower plate to thereby cause the circuit board to be inserted into the circuit board holder of the housing.

According to the invention, the housing is not provided with pilot pins—or at least not only the housing is provided with pilot pins—for the circuit board to be inserted therein. Rather, according to the invention the (mounting) tool used for mounting the circuit board is (at least also) provided with at least one pilot pin, but preferably a number of pilot pins, which can be inserted into a number of corresponding pilot holes of the circuit board, corresponding in number to the pilot pins. According to the method, the circuit board provided with the at least one pilot hole is first placed onto the or each corresponding pilot pin of the tool. The length of the or each pilot pin is in this case dimensioned such that the or each pilot pin protrudes beyond the fitted-on circuit board on the side facing away from the tool. Preferably, at least two pilot pins and a corresponding number of corresponding pilot holes are provided in order to adjust the circuit board on the tool securely in terms of turning and tilting.

Expediently, the or each pilot pin is aligned with respect to its longitudinal direction (also: axial direction) substantially perpendicularly to the pushed-on circuit board and is dimensioned in such a way that it protrudes beyond the pushed-on circuit board by a multiple of the circuit board thickness, for example by at least five times.

After the fitting of the circuit board onto the tool, the latter is displaced toward a circuit board holder of the housing, so that at least one pilot pin of the tool engages in a corresponding centering hole (also: centering bore) of the circuit board holder. The tool is thereby advanced toward the circuit board holder until the circuit board has reached its intended mounting position in the circuit board holder.

In the same way as the corresponding pilot hole and the possibly associated centering hole, the or each pilot pin preferably has a round cross section. However, the pilot pin, the pilot hole and the centering hole may also be provided with a non-round cross section, made to match one another. This is particularly advisable for securing the circuit board against twisting with respect to the tool whenever only one pilot pin, and correspondingly only one pilot hole and one centering hole, are provided.

The circuit board holder is preferably formed as a concave, particularly pan- or shell-like depression of the housing, which encloses the inserted circuit board from a number of sides. The circuit board holder may, however, in principle also be a planar housing area onto which the circuit board is placed in a freestanding manner. In this case, the circuit board holder is also referred to as a circuit board rest.

During or after the advancement of the tool, the circuit board is fixed in the housing. Subsequently, the tool is withdrawn, the or each pilot pin being pulled out from the corresponding pilot hole of the circuit board, and the circuit board remaining in the circuit board holder. The fixing of the circuit board in the housing may in principle take place here by any desired fastening method, such as for example by clamping, interlocking, welding or else adhesively bonding the circuit board in the housing.

A major advantage of the mounting principle according to the invention is that the or each pilot pin arranged on the tool can be designed largely independently of the geometry and other structural requirements of the housing. In particular, the or each pilot pin may in principle be of any length, whereby play-free guidance of the pilot pin in the or each centering hole of the housing can be realized comparatively easily. In particular, sufficiently long dimensioning of the or each pilot pin advantageously makes it possible that it already engages in the corresponding centering hole with little play manner before the circuit board comes into contact with the circuit board holder. Consequently, damage to the circuit board or the components located on it by component parts of the circuit board holder can be reliably avoided.

In a particularly preferred embodiment of the mounting method, during the introduction of the circuit board into the circuit board holder of the housing, a press-contact connection is closed in that a press-contact pin of an electrical terminal conductor that is located in the housing penetrates into a corresponding contact hole of the circuit board, so that the circuit board material in the area around the contact hole is deformed and, as a result, a force closure or friction fit is formed between the press-contact pin and the circuit board. In a way that is in itself customary, the press-contact pin is in this case pressed into the contact opening of the circuit board. In an equivalent way, the or each contact pin may also be fastened on the circuit board and interact with a contact hole in the housing to establish the press-contact connection. In principle, it would also be possible to provide both contact pins and corresponding contact holes respectively on both the circuit board and the housing.

In principle, furthermore, in addition to the press-contact connection, further means for fixing the circuit board to the housing may be provided, for example engaging lugs at the edge of the circuit board holder, which engage with a form fit around the inserted circuit board. In a preferred embodiment of the invention, however, the circuit board is fixed in the housing or in the circuit board holder exclusively or at least predominantly by the press-contact connection. The term "predominantly" should be understood here as meaning that the press-contact connection has a greater tear-off resistance than all the further means there may possibly be for fixing the circuit board in the circuit board holder.

In a particularly expedient embodiment of the invention, when the circuit board is placed onto the tool, the or each pilot pin forms with the pilot holes of the circuit board a—nondestructively releasable—force closure or form fit, which holds the circuit board captively on the tool, at least counter to its own weight. In particular, at least two pilot pins are for this purpose dimensioned with respect to the corresponding pilot holes in such a way that they are elastically deformed slightly during the placing on of the circuit board.

In an expedient development of this variant of the invention, it is provided that, after the insertion and fixing of the circuit board in the circuit board holder, the captive securement of the circuit board on the tool that is brought about by the or each pilot pin is forcibly released, or at least forcibly loosened, by means of a detaching mechanism, which can be moved with respect to the or each pilot pin.

The forcible release or loosening of the force closure or form fit that is formed between the or each pilot pin and the circuit board has the effect that the stress that would act on the circuit board during the withdrawal of the tool on account of the force closure or form fit of the circuit board on the tool on the one hand and on account of the fixing of the circuit board in the circuit board holder on the other hand is suppressed or at least reduced. In other words, the tool can therefore be withdrawn without the circuit board being stressed to a considerable extent between the tool and the housing. Consequently, the mounting method treats the circuit board gently, and the risk of production defects is reduced.

In a particularly simple embodiment, the detaching mechanism is formed by an ejector, in particular in the form of a ram, the position of which is initially kept unchanged during the withdrawal of the tool, so that the ejector holds the circuit board in the circuit board holder.

As an alternative or in addition to such an ejector, the detaching mechanism may also comprise means which deform, in particular laterally bend or narrow, the or each pilot pin during the withdrawal of the tool.

The mounting tool provided for carrying out the mounting method according to the invention particularly comprises a (tool) upper plate, on which the or each pilot pin is directly or indirectly provided, and a (tool) lower plate, which has a housing holder for holding the housing. In this case, the circuit board can be placed as intended onto the or each pilot pin. By displacing the upper plate toward the lower plate, the circuit board can be inserted into the housing or into a circuit board holder of the housing as provided by the mounting method according to the invention.

In a preferred embodiment of the mounting tool, the or each pilot pin runs conically, at least in a portion of the free end, and consequently tapers, advantageously facilitating on the one hand the fitting of the circuit board onto the or each pilot pin but on the other hand also the centering of the pilot pin in the at least one centering hole of the housing.

For further assisting good positioning of the circuit board in the housing, the upper plate is preferably linearly guided with respect to the lower plate in a direction of advancement. In an embodiment that is expedient and can be easily realized, for this purpose the mounting tool has at least one guiding bolt, preferably at least two guiding bolts, which in interaction with associated guiding grooves or bores align the upper plate with respect to the lower plate transversely to the direction of advancement with little play and guide it during the advancement.

For low-stress forcible detachment of the circuit board from the upper plate of the tool, in an expedient design the tool has an ejector of the type and operating mode described above, in particular in the form of at least one ram that can be displaced in relation to the upper plate of the tool in the direction of advancement.

In an application that is primarily pursued, the mounting method according to the invention and/or the associated mounting tool are used for circuit board mounting in the case of an electronic vehicle module, particularly an electrical window lifter.

Other features which are considered as characteristic for the invention are set forth in the appended claims.

Although the invention is illustrated and described herein as embodied in Mounting method for mounting a circuit board in a housing and associated mounting tool, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
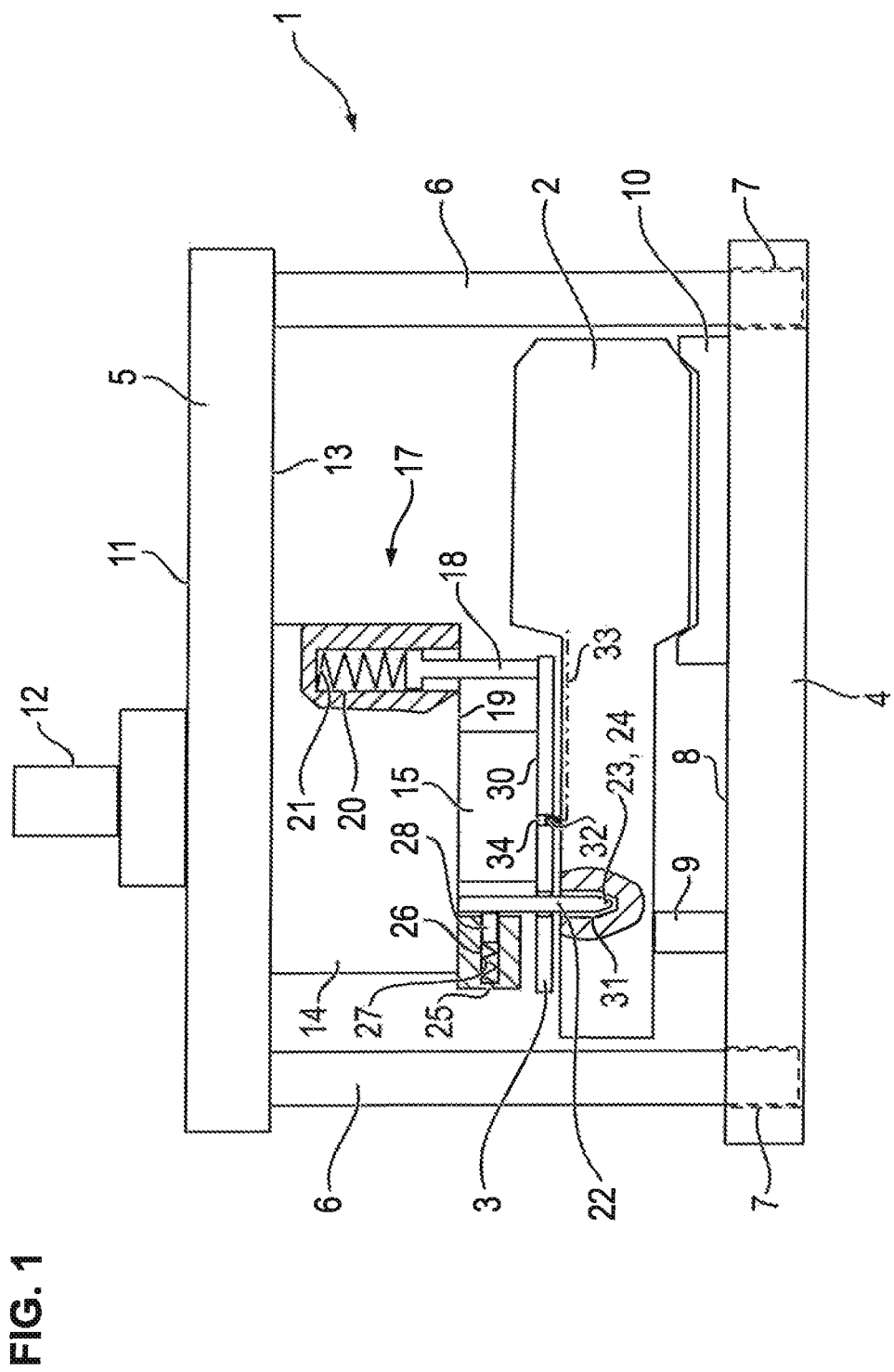
FIG. 1 shows in a schematic side view a mounting tool for mounting a circuit board in a housing.

Referring now to the figures of the drawing in detail in which functionally and structurally corresponding parts are identified with the same designations, and first, particularly, to FIG. 1 thereof, there is shown a roughly schematic, partly sectional side view of a mounting tool 1, into which a (likewise partly in section) housing 2 and a circuit board 3 for mounting in the housing 2 have been inserted.

The mounting tool 1 comprises a lower plate 4, resting as intended on a working surface, and an upper plate 5. The plates 4 and 5 are aligned substantially plane-parallel to each other. Two substantially vertical guiding bolts 6 are arranged on mutually opposite sides of the mounting tool 1 for positioning the two plates 4, 5. The guiding bolts 6 have been respectively pressed into the upper plate 5, into an exact-fit bore, while they are guided with (slight) play in the lower plate 4, in each case in a bore 7. Alternatively, the guiding bolts 6 may also be fastened to the lower plate 4, in this case the upper plate 5 being displaceable with respect to the guiding bolt 6.

A supporting spigot 9 and an approximately pan-shaped housing holder 10 are arranged on an upper side 8 of the lower plate 4. The spigot 9 and the holder 10 enable the housing 2 to be positioned and fixed in place on the lower plate 4.

Fastened to an upper side 11 of the upper plate 5 is a clamping-in spigot 12, which serves for fastening the upper plate 5 in a press device. Adjoining an underside 13 of the upper plate 5 that is opposite from the upper side 11 there is first a substantially cuboidal spacer 14, on which there is provided, on a side facing away from the upper plate 5, a likewise substantially cuboidal pressing-in body 15, which however is made smaller in its dimensions than the spacer 14.

Integrated in the spacer 14 is at least one ejector 17. The ejector 17 comprises an ejecting ram 18, which is guided in a bore 20, introduced from the underside 19 of the spacer 14. The ejecting ram 18 is pretensioned in the direction of the lower plate 4 by a spring 21.

From the underside 19 of the spacer 14 there also protrude three pilot pins 22 in the direction of the lower plate 4, only one of which is represented by way of example. The pilot pins 22 protrude substantially at right angles from the underside 19. Each pilot pin 22 is formed substantially by a cylindrical spigot, which tapers conically toward its free end 23, remote from the underside 19, in an end portion 24.

In addition or as an alternative to the ejector 17, the tool 1 comprises for each pilot pin 22 an associated deflecting body 25, which laterally flanks the assigned pilot pin 22. Introduced into the deflecting body 25 is a bore 26, which is open toward the pilot pin 22 and in which there lies a ram 28. By acting on the ram 28, the pilot pin 22 can be deflected (to a small extent), i.e. moved transversely to its axis. The ram 28 is pretensioned in the direction of the pilot pin 22 by a spring 27.

As shown in FIG. 1, the circuit board 3 is fitted onto the pilot pins 22 plane-parallel to the upper plate 5 and to the underside 30 of the pressing-in body 15. For mounting, the circuit board 3 is then inserted into the housing 2 by advancing the upper plate 5 in the direction of the lower plate 4, the pilot pin 22 engaging in a centering hole 31 in the housing. In the course of the advancement, a number of press-contact pins 32 (only one of which is indicated in FIG. 1 by way of example) of an electrical terminal conductor 33 on the housing are pressed into corresponding contact holes 34 (only one of which is likewise indicated in FIG. 1 by way of example) of the circuit board 3.

Figure 2:
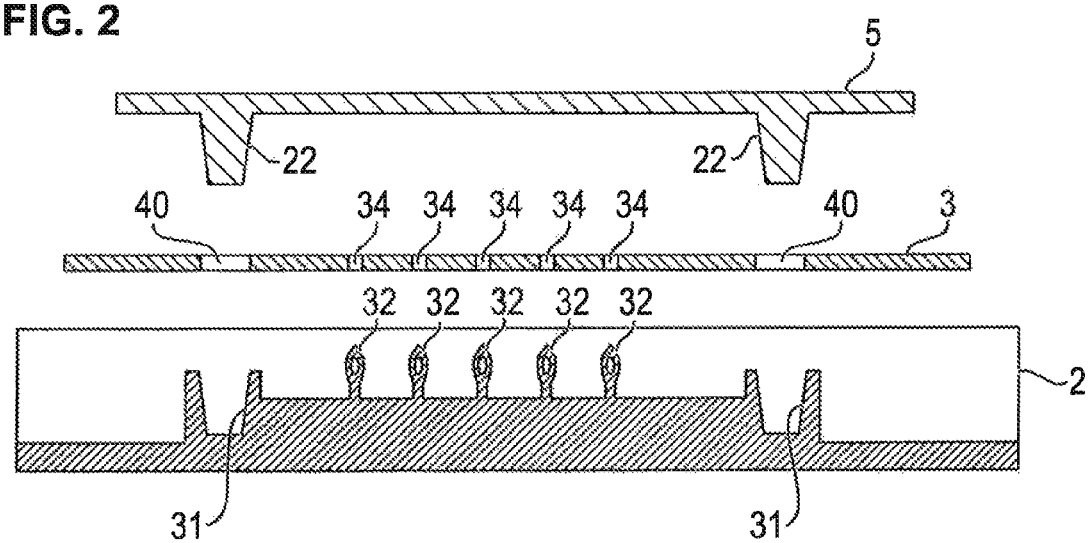
FIGS. 2 to 6 show in a schematic representation various, successive mounting stages of a circuit board mounting method that is carried out by way of the mounting tool illustrated in FIG. 1.

Details of the sequence of the mounting method can be taken from FIGS. 2 to 6. FIG. 2 schematically shows in a greatly simplified form the upper plate 5 of the mounting tool 1, the circuit board 3 and the housing 2 in a pre-mounting state. FIGS. 3 to 6 respectively show the upper plate 5, the circuit board 3 and the housing 2 in the same representation in successive snapshots during the mounting method.

As shown in FIG. 2, the circuit board 3 has two (passing-through) pilot holes 40 and the likewise passing-through contact holes 34 (five in the example represented). Each contact hole 34 is metalized, at least in the region of its wall. Arranged in the housing 2 are a number of press-contact pins 32, corresponding in number to contact holes 34. Also introduced into the housing 2 are the centering holes 31 assigned to the pilot pins 22.

Figure 3:
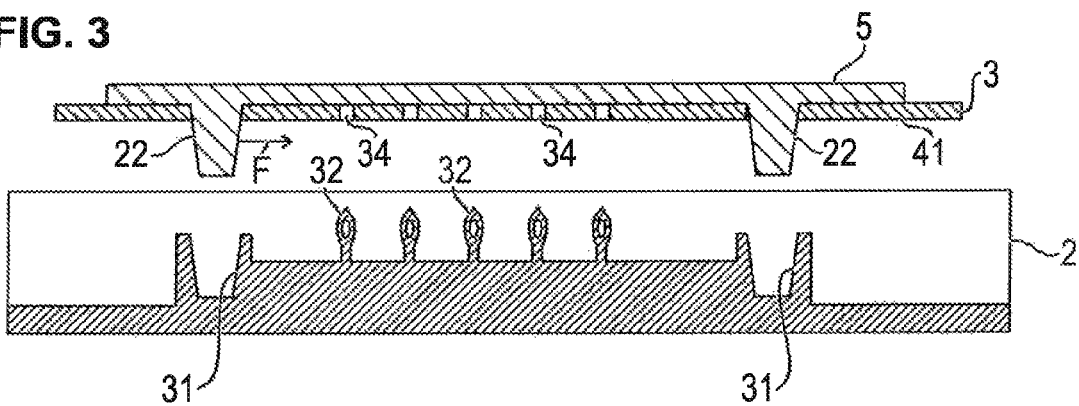

As shown in FIG. 3, in a first mounting step the circuit board 3 is pushed onto the pilot pins 22, so that they penetrate the pilot holes 40 of the circuit board 3. On a side 41 facing away from the tool, the pilot pins 22 in this case protrude beyond the circuit board 3 by a multiple of the thickness of the circuit board. The pilot holes 40 have a slightly smaller spacing from one another here than the corresponding pilot pins 22, so that the pilot pins 22 are slightly bent toward one another when the circuit board 3 is placed on. As a result, the circuit board 3 is braced between the pilot pins 22 and is held on the upper plate 5 with force closure. The force closure formed in this way between the pilot pins 22 and the circuit board 3 is at least strong enough that it can take the weight of the circuit board 3, including the components mounted on it. The circuit board 3 is consequently captively fixed on the upper plate 5 and is aligned and positioned in relation to the upper plate 5 by the clamping.

The pushing on of the circuit board 3 is facilitated by the deflecting bodies 25, which are respectively assigned to the pilot pins 22 and the respective spring 27 of which is tensioned by a tensioning mechanism (not explicitly shown) when the upper plate 5 is in its upper position. The ram 28 is pressed against the associated pilot pin 22 by the tensioned spring 27. As a result, the pilot pins 22 are deflected in such a way that the circuit board 3 can be pushed onto the pilot pins 22 comparatively easily. When the upper plate 5 is lowered, the spring 27 of each deflecting body 25 is completely or partially relaxed, so that the ram 28 relieves the associated pilot pin 22. As a result, the pilot pins 22 bend back into their normal position, whereby the circuit board 3 is braced.

Figure 4:
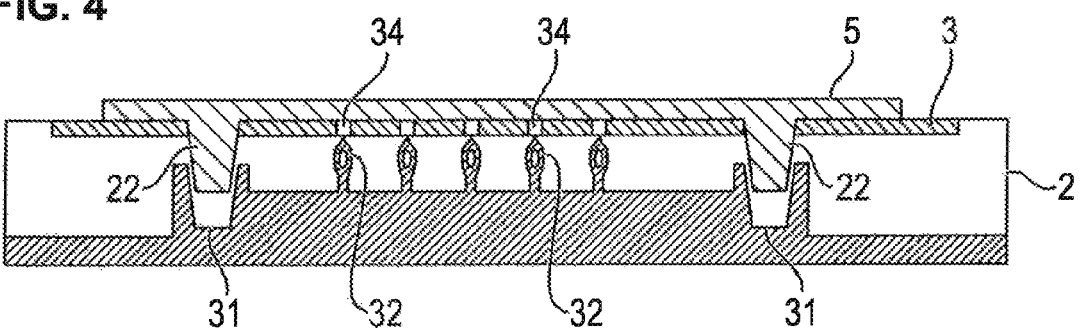

It can be seen from FIG. 4 that, in a second step of the mounting method, the upper plate 5 with the circuit board 3 fastened to it is advanced toward the housing 2 (mounted on the lower plate 4 as shown in FIG. 1) in such a way that the pilot pins 22 engage in the corresponding centering holes 31 of the housing 2. In particular, the pilot pins 22 already engage in the centering holes 31 when the circuit board 3 is still arranged at a distance other than zero from the tips of the press-contact pins 32.

Figure 5:
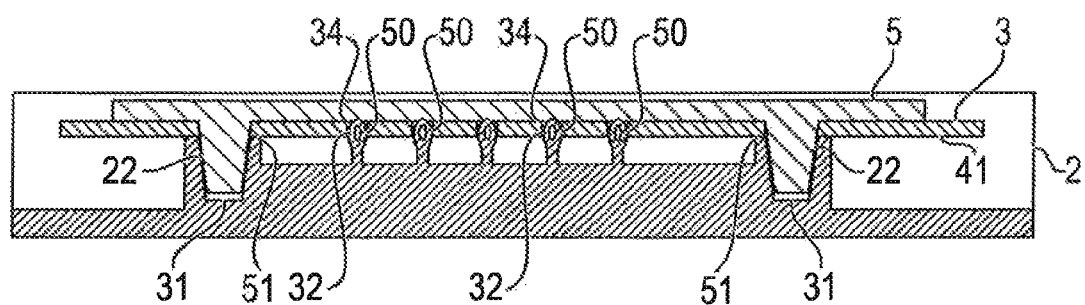

Only in a third step of the mounting method do the press-contact pins 32 penetrate into the associated contact holes 34 as shown in FIG. 5 with continued advancement of the upper plate 5 toward the housing 2, whereby press-contact connections 50 are closed. Each press-contact pin 32 thereby deforms the material of the circuit board in the area around the associated contact hole 34, whereby a force closure is formed between the circuit board 3 and the press-contact pins 32.

This force closure has the effect that the circuit board 3 is fixed in a circuit board holder 51 of the housing 2, in which the press-contact pins 32 are arranged.

Figure 6:
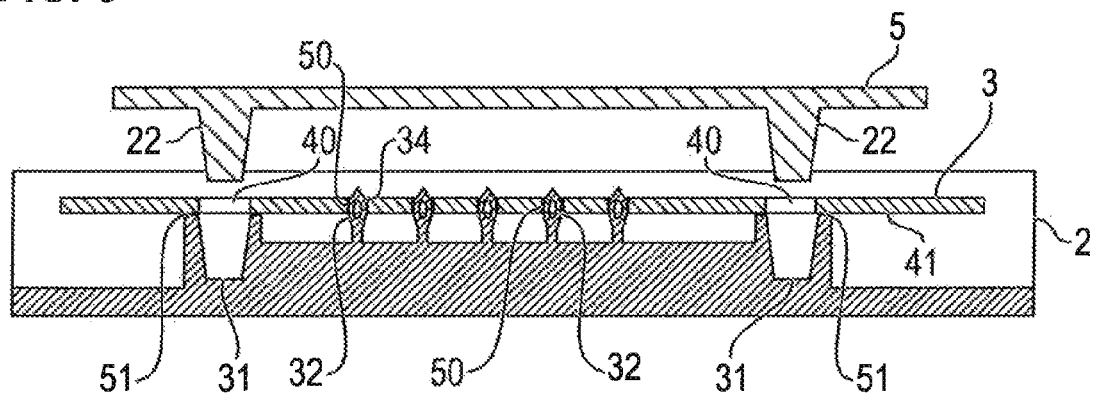

In a subsequent fourth step of the mounting method, the tool upper plate 5 is withdrawn again with respect to the housing 2 as shown in FIG. 6. The fixing of the circuit board 3 in the circuit board holder 51 that is brought about by the press-contact connections 50 is in this case stronger than the force closure that holds the circuit board 3 on the upper plate 5. As a result, the pilot pins 22 are pulled out from the pilot holes 40 of the circuit board 3 during the withdrawal of the upper plate 5. Therefore, during the withdrawal of the upper plate 5, the circuit board 3 is detached from the latter and remains in its intended mounted state in the circuit board holder 51 of the housing 2.

Depending on the embodiment of the tool 1, the detachment of the circuit board 3 from the upper plate 5 is assisted by the or each ejector 17 and/or the or each deflecting body 25, which to this extent act as a detaching mechanism for the circuit board 3.

In a simple embodiment, the ejector 17 only assists the detachment of the circuit board 3 passively, in that the ejecting ram 18—here constantly pretensioned by the spring 21—weakens the force closure holding the circuit board on the pilot pins 22. The ejector 17 is optionally assigned a tensioning mechanism (not explicitly represented), which temporarily tensions the spring 21 only during the withdrawal of the upper plate 5, and consequently increases the pressure exerted by the ejecting ram 18 on the circuit board 3.

In further-developed embodiments of the mounting tool 1, the or each ejector 17 and/or the or each deflecting body 25 is assigned a drive—for example a pneumatic, hydraulic or electromechanical drive—by which the or each ejecting ram 18 or each ram 28 can be moved with respect to the pilot pins 22 for forcible detachment of the circuit board 3.

The or each ejector 17 assists the detachment of the circuit board 3 here in particular in that, during the withdrawal of the upper plate 5, the ejecting ram 18 is advanced to the same extent with respect to the upper plate 5. Consequently, during the withdrawal of the upper plate 5, the ejecting ram 18 is kept unchanged in its position and continues to press the circuit board 3 against the circuit board holder 51. As a difference from the simplified representation as shown in FIG. 1, the or each ejector 17 is preferably arranged as close as possible to an assigned pilot pin 22, in order to minimize the stressing, in particular bending, of the circuit board 3 when the pilot pins 22 are pulled out.

The or each deflecting body 25 assists the detachment of the circuit board 3 here in particular in that, during the withdrawal, the ram 28 is pressed against the assigned pilot pin 22, and deflects it slightly. As a result, the force closure formed between the pilot pins 22 and the circuit board 3 is relieved, so that the pilot pins 22 can be pulled out from the assigned pilot holes 40 more easily.

The following is a list of reference numerals used in the description which may aid the reader in the perusal of the specification:

1 mounting tool
2 housing
3 circuit board
4 lower plate
5 upper plate
6 guiding bolt
7 bore
8 upper side
9 supporting spigot
10 housing holder
11 upper side
12 clamping-in spigot
13 underside
14 spacer
15 pressing-in body
17 ejector
18 ejecting ram
19 underside
20 bore
21 spring
22 pilot pin
23 free end
24 end portion
25 deflecting body
26 bore
27 spring
28 ram
30 underside
31 centering hole
32 press-contact pin
33 terminal conductor
34 contact hole
40 pilot hole
41 side 50 press-contact connection
51 circuit board holder

The invention claimed is:

1. A method of mounting a circuit board in a housing, the method which comprises:
   providing a circuit board with at least one pilot hole and placing the circuit board onto a mounting tool having a number of pilot pins, wherein each of the number of pilot pins protrudes through and projects beyond the circuit board on a side facing away from the mounting tool;
   displacing the mounting tool toward a circuit board holder of the housing to cause the pilot pins or at least one of the pilot pins to engage in a corresponding centering hole of the circuit board holder;
   fixing the circuit board in the housing; and
   withdrawing the mounting tool by detaching each pilot pin from the corresponding pilot hole, with the circuit board remaining in the circuit board holder.

2. The mounting method according to claim 1, wherein said at least one pilot hole is one of a plurality of pilot holes formed in the circuit board and the mounting tool is provided with a plurality of pilot pins disposed at locations corresponding to locations of the pilot hoes of the circuit board.

3. The mounting method according to claim 1, which comprises, during an introduction of the circuit board into the circuit board holder, closing a press-contact connection by causing a press-contact pin of an electrical terminal conductor disposed in the housing to penetrate into a corresponding contact hole of the circuit board, and thereby forming a force closure.

4. The mounting method according to claim 3, which comprises fixing the circuit board in the housing exclusively by the press-contact connection.

5. The mounting method according to claim 3, which comprises fixing the circuit board in the housing primarily by the press-contact connection.

6. The mounting method according to claim 1, wherein, when the circuit board is placed onto the mounting tool, the or each pilot pin forms with the circuit board a connection holding the circuit board on the mounting tool counter to a weight thereof.

7. The mounting method according to claim 6, wherein the connection between the mounting tool and the circuit board is a friction closure or a form fit connection.

8. The mounting method according to claim 6, which comprises, during or after the insertion of the circuit board into the housing, forcibly releasing the connection between each pilot pin and the circuit board by moving a detaching mechanism relative to the pilot pin.

* * * * *